US006462403B1

(12) United States Patent
Uochi

(10) Patent No.: US 6,462,403 B1
(45) Date of Patent: *Oct. 8, 2002

(54) SEMICONDUCTOR DEVICE COMPRISING THIN FILM TRANSISTORS HAVING A PASSIVATION FILM FORMED THEREON

(75) Inventor: Hideki Uochi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/641,769

(22) Filed: Aug. 21, 2000

Related U.S. Application Data

(62) Division of application No. 09/222,730, filed on Dec. 29, 1998, now Pat. No. 6,133,620, which is a division of application No. 08/803,865, filed on Feb. 21, 1997, now Pat. No. 5,897,345, which is a continuation of application No. 08/451,649, filed on May 26, 1995, now abandoned.

(30) Foreign Application Priority Data

May 31, 1994 (JP) .............................................. 6-142448

(51) Int. Cl.[7] .......................... H01L 23/58; H01L 29/04; H01L 31/20; H01L 31/036; H01L 31/0376
(52) U.S. Cl. ........................... 257/640; 257/59; 257/72; 257/350; 257/639; 257/649
(58) Field of Search ................................. 257/639, 640, 257/649, 59, 72, 350

(56) References Cited

U.S. PATENT DOCUMENTS

| 4,385,937 A | 5/1983 | Ohmura |
| 4,463,492 A | 8/1984 | Maeguchi |
| 4,466,179 A | 8/1984 | Kasten |
| 4,468,855 A | 9/1984 | Sasaki |
| 4,625,224 A | 11/1986 | Nakagawa et al. |

(List continued on next page.)

FOREIGN PATENT DOCUMENTS

| JP | 1-276672 | 11/1989 |
| JP | 3-23639 | 1/1991 |
| JP | 04-078826 | 3/1992 |
| JP | 5-55581 | 3/1993 |
| JP | 5-55582 | 3/1993 |
| JP | 06-075247 | 3/1994 |
| JP | 07-326766 | 12/1995 |
| JP | 63-120443 | 5/1998 |

Primary Examiner—Ngân V. Ngô
(74) Attorney, Agent, or Firm—Eric J. Robinson; Robinson Intellectual Property Law Office PC

(57) ABSTRACT

A semiconductor device comprising a thin film transistor, and a process for fabricating the same, the process comprising: a first step of forming an island-like semiconductor layer, a gate insulating film covering the semiconductor layer, and a gate electrode comprising a material containing aluminum as the principal component formed on the gate insulating film; a second step of introducing impurities into the semiconductor layer in a self-aligned manner by using the gate electrode as the mask; a third step of forming an interlayer dielectric to cover the gate electrode, and forming a contact hole in at least one of source and drain; a fourth step of forming over the entire surface, a film containing aluminum as the principal component, and then forming an anodic oxide film by anodically oxidizing the film containing aluminum as the principal component; a fifth step of etching the film containing aluminum as the principal component and the anodic oxide film, thereby forming a second layer interconnection containing aluminum as the principal component; and a sixth step of forming over the second layer interconnection, a film containing silicon nitride as the principal component thereof.

33 Claims, 4 Drawing Sheets

U.S. PATENT DOCUMENTS

| | | |
|---|---|---|
| 4,656,101 A | 4/1987 | Yamazaki |
| 4,727,044 A | 2/1988 | Yamazaki |
| 4,746,628 A | 5/1988 | Takafuji et al. |
| 4,782,037 A | 11/1988 | Tomozawa et al. |
| 4,851,363 A | 7/1989 | Troxell et al. |
| 4,933,298 A | 6/1990 | Hasegawa |
| 5,040,037 A | 8/1991 | Yamaguchi et al. |
| 5,063,431 A | 11/1991 | Ohshima |
| 5,065,222 A * | 11/1991 | Ishii |
| 5,130,772 A | 7/1992 | Choi |
| 5,182,620 A * | 1/1993 | Shimada et al. ............... 257/72 |
| 5,306,651 A | 4/1994 | Masumo et al. |
| 5,313,075 A | 5/1994 | Zhang et al. |
| 5,323,042 A * | 6/1994 | Matsumoto ................. 257/350 |
| 5,328,861 A | 7/1994 | Miyakawa |
| 5,395,804 A | 3/1995 | Ueda |
| 5,396,084 A * | 3/1995 | Matsumoto ................. 257/72 |
| 5,403,772 A | 4/1995 | Zhang et al. |
| 5,412,493 A * | 5/1995 | Kunii et al. ................... 359/59 |
| 5,424,230 A | 6/1995 | Wakai |
| 5,439,837 A | 8/1995 | Hata et al. |
| 5,457,058 A | 10/1995 | Yonehara |
| 5,468,986 A * | 11/1995 | Yamanashi ................. 257/389 |
| 5,470,763 A | 11/1995 | Hamada |
| 5,508,216 A | 4/1996 | Inoue |
| 5,523,257 A | 6/1996 | Yamazaki et al. |
| 5,561,319 A * | 10/1996 | Owens et al. ................ 257/649 |
| 5,612,234 A | 3/1997 | Ha |
| 5,663,077 A | 9/1997 | Adachi et al. |
| 5,696,386 A * | 12/1997 | Yamazaki .................... 257/57 |
| 5,717,224 A | 2/1998 | Zhang |
| 5,815,223 A | 9/1998 | Watanabe |
| 5,897,345 A | 4/1999 | Uochi |
| 6,133,620 A * | 10/2000 | Uochi ........................ 257/649 |
| 6,166,414 A * | 12/2000 | Miyazaki et al. ........... 257/369 |

* cited by examiner

SEMICONDUCTOR DEVICE COMPRISING THIN FILM TRANSISTORS HAVING A PASSIVATION FILM FORMED THEREON

This application is a Divisional of application Ser. No. 09/222,730 filed Dec. 29, 1998, now U.S. Pat. No. 6,133,620; which itself is a Divisional of application Ser. No. 08/803,865 filed Feb. 21, 1997, now U.S. Pat. No. 5,897,345; which is a Continuation of application Ser. No. 08/451,649 filed May 26, 1995, abandoned.

BACKGROUND OF THE INVENTION

The present invention relates to a semiconductor device using a TFT (thin film transistor), and to a process for fabricating the same. More particularly, the present invention relates to a semiconductor device usable for a liquid crystal display device of an active matrix type.

Semiconductor devices comprising TFTs include liquid crystal display devices of active matrix type and image sensors. When exposed to air, the TFTs for use in the devices enumerated above undergo degradation due to moisture, etc., of the air. This problem is overcome by covering the TFT with a passivation film of a material containing silicon nitride as the principal component thereof. However, in case aluminum is used for the source/drain electrodes and interconnections under the passivation film, hillocks tend to generate on the surface of the aluminum film due to the heat which generates at the deposition of a passivation film. Hillocks lead to a problem of short circuit.

SUMMARY OF THE INVENTION

In the light of the aforementioned problems, an object of the present invention is to prevent hillocks from generating during formation of a passivation film by forming an anodic oxidation film on the surface of the aluminum interconnection for a thickness of from 50 to 500 Å.

Contact holes are formed first on the source/drain by a known process for fabricating a TFT. Then, an aluminum film for forming an aluminum interconnection is deposited to a thickness of from 3,000 Å to 2 μm, preferably, for a thickness of from 4,000 to 8,000 Å. To suppress the occurrence of hillocks, the aluminum film may contain up to about 5% by weight of an impurity such as Si, Sc, and Cu.

The resulting structure is subjected to anodic oxidation in an electrolytic solution by applying a current to form a barrier type anodic oxide for a thickness of from 50 to 500 Å. The barrier type anodic oxide is particularly suitable for the object of the present invention because it is hard and dense. The barrier type anodic oxide can be formed by connecting the article to the positive electrode in a proper electrolytic solution kept substantially neutral, and by applying a current while elevating the voltage.

More particularly, for instance, an L-tartaric acid diluted to a concentration of 5% by using ethylene glycol and pH-controlled to a value around 7 can be used as the electrolytic solution. The substrate is immersed into the solution, and the positive side of the constant current supply is connected to the aluminum film on the substrate while connecting the negative side to the platinum electrode. Then, oxidation is continued under voltage while maintaining the current constant, until a value in the range of from 5 to 30 V is attained. Oxidation is thereafter continued under a constant voltage until almost no current is found to flow any more. Thus is obtained an aluminum oxide film on the surface of the aluminum film. The thickness of the aluminum oxide film increases linearly with increasing voltage; thus, a thicker film is obtained for a higher voltage.

The thicker the aluminum oxide film is, the better the function as a barrier becomes. A higher voltage must be applied to obtain a thicker film. However, as the applied voltage increases, a fear of element breakdown also arises.

Thus, the voltage and the thickness for the aluminum oxide must be determined to a level as such that the element would not be destroyed.

The aluminum film and the aluminum oxide film thus obtained are etched to form an aluminum interconnection whose surface is covered by an aluminum oxide film. By forming a passivation film on the surface of the resulting structure, the generation of hillocks can be prevented by the anodic oxide film.

A passivation film can be formed without generating any hillocks on the surface of the aluminum interconnection by forming an anodic oxide film on the surface of the aluminum interconnection. Thus, failures as severe as to break the passivation film can be prevented from occurring. In this manner, a thin passivation film particularly effective in forming fine TFTs can be obtained. In case of using the TFTs in the pixel portions of a liquid crystal display device, the generation of short circuit had been feared due to the hillocks that are formed on the electrodes and interconnections, which contact with the electrodes disposed opposed thereto. However, this problem short circuit can be overcome by utilizing the present invention, and the total product yield can be improved.

DETAILED DESCRIPTION OF THE PRESENT INVENTION

The present invention is described in further detail below by referring to specific examples.

EXAMPLE 1

Figure 1A:
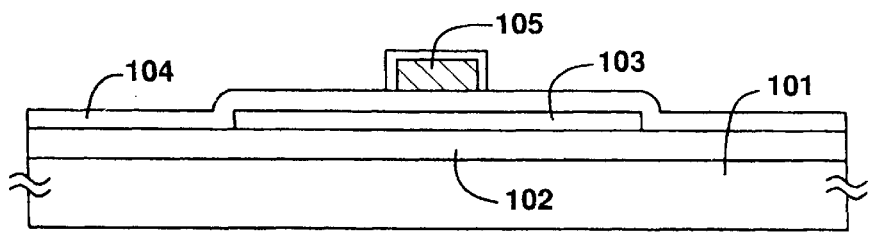
FIGS. 1(A) to 1(D) are each process steps according to the process of Example 1.
Figure 1B:
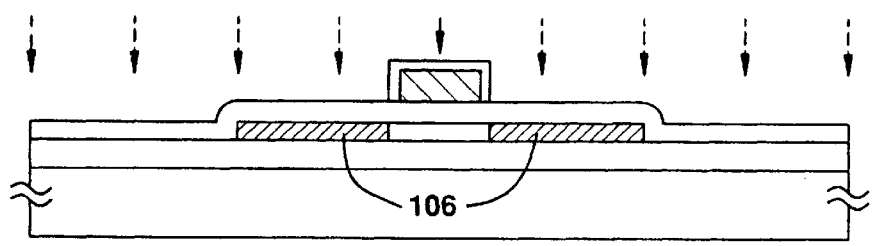
Figure 1C:
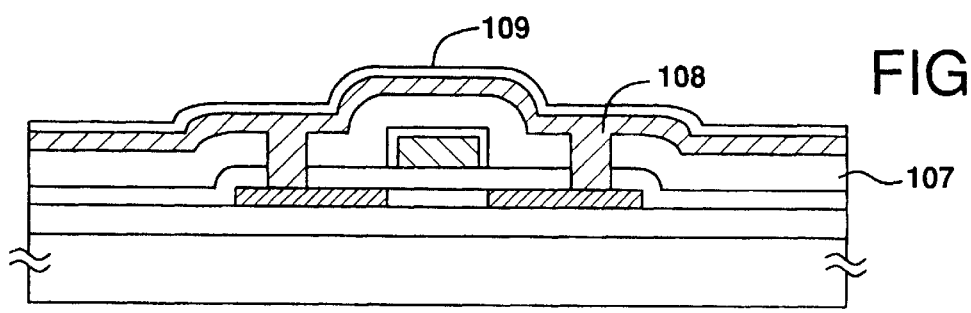
Figure 1D:
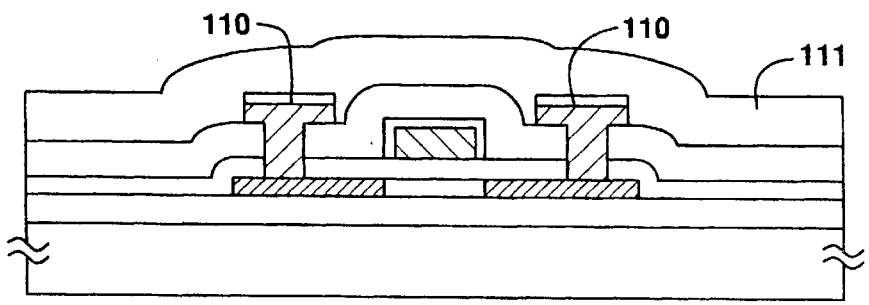

Referring to FIGS. 1(A) to 1(D), an example according to an embodiment of the present invention is described below. A silicon oxide film 102 from 1,000 to 5,000 Å in thickness was deposited as a base film on a Corning 7059 substrate 101 (100×1,000 nm$^2$ in area); more specifically, for instance, at a thickness of 2,000 Å. The oxide film can be deposited, for example, by sputtering or by decomposing TEOS using plasma CVD. The oxide film in this case was deposited by sputtering under an oxygen atmosphere. The silicon oxide film thus formed may be annealed in the temperature range of from 400 to 650° C.

An amorphous silicon film was deposited thereafter by plasma CVD or by LPCVD to a thickness of from 300 to 5,000 Å, preferably in a range of from 400 to 1,000 Å, for instance, to a thickness of 500 Å. The amorphous silicon film thus obtained was crystallized thereafter by annealing it in a temperature range of from 550 to 600° C. under a reducing atmosphere for a duration of from 8 to 24 hours. Nickel may be added in a trace amount to accelerate the crystallization. Otherwise, the crystallization step may be effected by irradiating a laser radiation. The crystallized silicon film thus obtained was etched to form an island-like region 103. A gate insulating film was formed thereon by depositing a 700 to 1,500 Å thick, more specifically, a 1,200 Å thick silicon oxide film 104 using plasma CVD.

An aluminum film containing 1% by weight of silicon, or from 0.1 to 0.3% by weight of scandium (Sc) was deposited by sputtering to a thickness of from 1,000 Å to 3 µm, for instance, to a thickness of 5,000 Å. The resulting film was etched to obtain a gate electrode 105. The gate electrode 105 was then anodically oxidized in an electrolytic solution by applying current. Thus was formed an anodic oxide from 500 to 2,500 Å in thickness, for instance, a 2,000 Å thick anodic oxide was obtained. The electrolytic solution used herein was an L-tartaric acid diluted to a concentration of 5% by using ethylene glycol and pH-controlled to a value of 7.0±0.2. The substrate was then immersed in the solution, and the positive side of a constant current supply was connected to the gate electrode on the substrate while connecting the negative side to a platinum electrode. By applying a voltage at a constant current of 20 mA, the oxidation was continued until a voltage of 150 V was attained. The oxidation was further continued at a constant voltage of 150 V until the current decreased to 0.1 mA or lower. Thus was obtained a 2,000 Å thick aluminum oxide film (FIG. 1(A)).

An N-type impurity region 106 was formed by implanting impurity ions (phosphorus ions in this case) by means of ion doping into the island-like silicon film 103 in a self-aligned manner using the gate electrode portion 105 (i.e., the gate electrode and the surrounding anodic oxide film) as a mask. Thus, phosphorus was implanted at a dose of in a range of from $1\times10^{15}$ to $8\times10^{15}$ cm$^{-2}$ under an accelerating voltage of from 60 to 90 kV. More specifically in this case, phosphorus was implanted at a dose of $5\times10^{15}$ cm$^{-2}$ under an accelerating voltage of 80 kV.

Then, laser radiation was irradiated to the resulting structure using a KrF excimer laser operated at a wavelength of 248 nm and at a pulse width of 20 nsec, to activate the doped impurity. The laser was operated at an energy density of from 200 to 400 mJ/cm$^2$, more preferably, at an energy density of from 250 to 300 mJ/cm$^2$. Alternatively, thermal annealing can be used in the place of laser annealing, although not applicable in this case because aluminum, which is inferior in heat resistance, is used in the present example as the electrode (FIG. 1(B)).

A 5,000 Å thick silicon oxide film 107 was deposited thereafter by means of CVD as an interlayer dielectric over the entire surface of the resulting structure. The interlayer dielectric 107 and the gate insulating film 104 were etched to form contact holes in the source/drain of the TFT Then, an aluminum film 108 was deposited to a thickness of from 3,000 Å to 2 µm, preferably from 4,000 to 8,000 Å, for instance, to a thickness of 5,000 Å by means of sputtering. Then, an anodic oxide 109 was formed to a thickness of from 40 to 500 Å, for instance, at a thickness of 100 Å by effecting anodic oxidation in an electrolytic solution in the same manner as described above. In this case again, the electrolytic solution was an L-tartaric acid diluted to a concentration of 5% by using ethylene glycol and pH-controlled to a value of 7.0±0.2. The substrate was immersed in the solution, and the positive side of a constant current supply was connected to the aluminum film 108 on the substrate while connecting the negative side to a platinum electrode. By applying a voltage at a constant current of 20 mA, the oxidation was continued until a voltage in a range of from 5 to 30 V, specifically in this case, 10 V, was attained. The oxidation was further continued at a constant voltage of 10 V until the current decreased to 0.1 mA or lower. Thus was obtained an aluminum oxide film about 2,000 Å in thickness (FIG. 1(C)).

The aluminum film 108 and the aluminum oxide film 109 thus obtained were etched to obtain a second layer aluminum interconnection 110. A passivation film 111 was formed thereafter to protect the element from the ambient. The passivation film 111 was a silicon nitride film deposited to a thickness of from 2,000 to 8,000 Å, for instance, 4,000 Å, by means of plasma CVD using a mixed gas of NH$_3$, SiH$_4$, and H$_2$. The substrate was maintained at a temperature in a range of from 250 to 350° C. during the film deposition (FIG. 1(D))

In general, hillocks generate on the surface of aluminum due to temperature rise in case a silicon nitride film is formed directly on the surface of aluminum film. In the present example, however, the anodic oxide film prevented hillocks from generating.

EXAMPLE 2

Figure 2A:
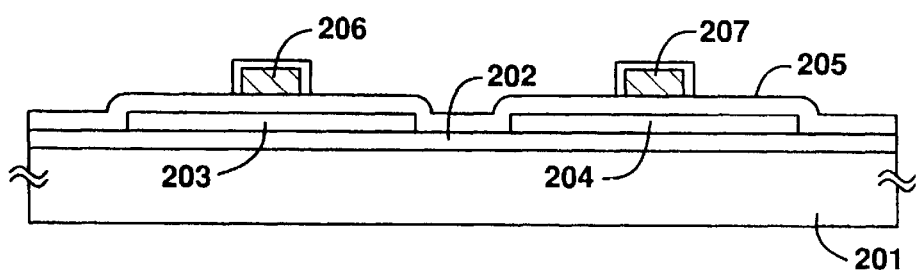
FIGS. 2(A) to 2(E) are each process steps according to the process of Example 2.
Figure 2B:
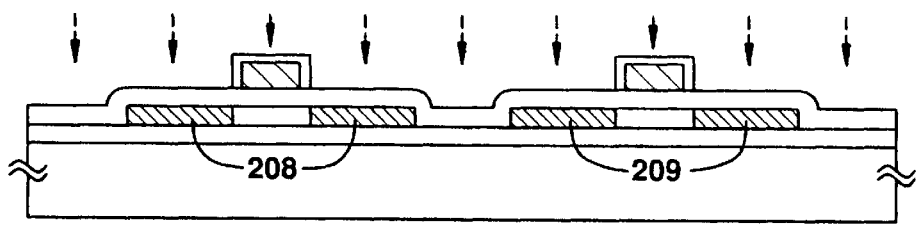
Figure 2C:
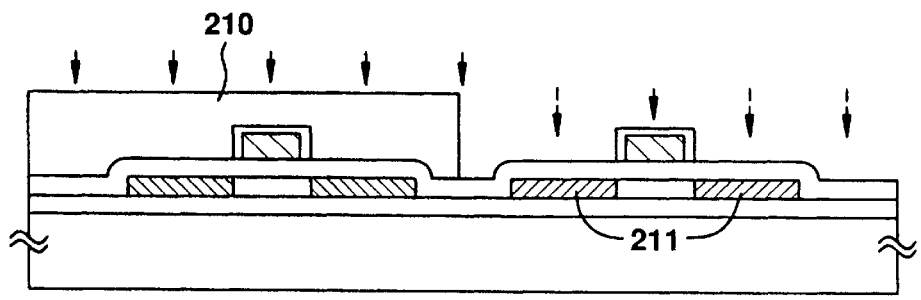
Figure 2D:
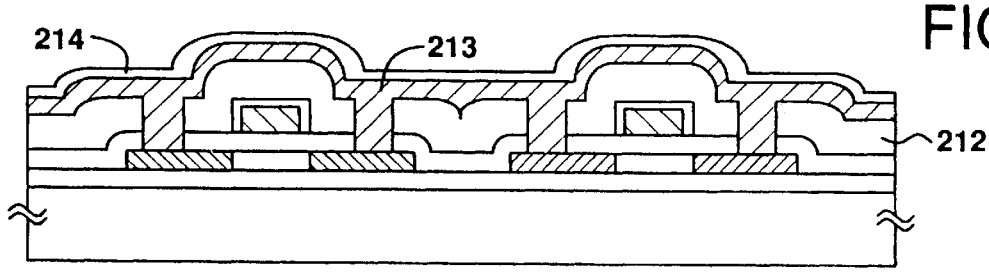
Figure 2E:
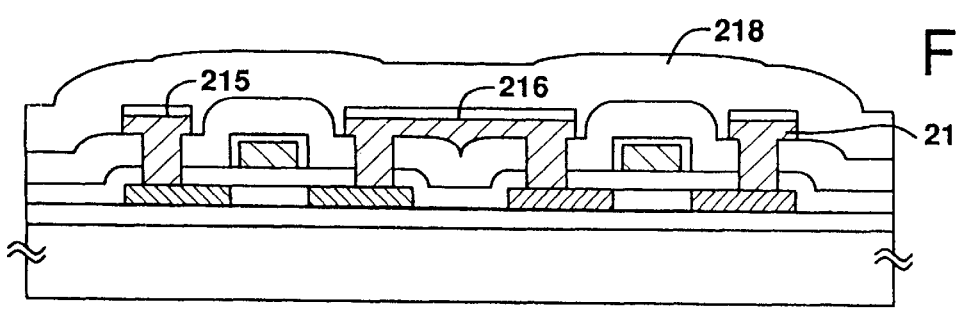

Referring to FIGS. 2(A) to 2(E), an example according to an embodiment of the present invention related to a CMOS TFT is described below. A silicon oxide film 202 from 1,000 to 5,000 Å in thickness, more specifically, for instance, at a thickness of 2,000 Å, was deposited as a base film on a substrate 201 by means of plasma CVD. The silicon oxide film thus formed may be annealed in the temperature range of from 400 to 650° C.

An amorphous silicon film was deposited thereafter by plasma CVD to a thickness of from 300 to 5,000 Å, preferably in a range of from 400 to 1,000 Å, for instance, to a thickness of 500 Å. The amorphous silicon film thus obtained was crystallized thereafter by annealing it in a temperature range of from 550 to 600° C. under a reducing atmosphere for a duration of from 8 to 24 hours. Nickel may be added in a trace amount to accelerate the crystallization. Otherwise, the crystallization step may be effected by irradiating a laser radiation. The crystallized silicon film thus obtained was etched to form island-like regions 203 and 204. A gate insulating film was formed thereon by depositing a 700 to 1,500 Å thick, more specifically, a 1,200 Å thick silicon oxide film 205 using plasma CVD.

An aluminum film was deposited by sputtering to a thickness of from 1,000 Å to 3 µm, for instance, to a thickness of 5,000 Å. The resulting film was etched to obtain gate electrodes 206 and 207. The gate electrodes were then anodically oxidized in an electrolytic solution by applying current. Thus was formed an anodic oxide from 500 to 2,500 Å in thickness, for instance, a 2,000 Å thick anodic oxide was obtained (FIG. 2(A)).

Impurities were implanted by means of ion doping in a self-aligned manner into the island-like films 203 and 204 by using the gate electrode portions 206 and 207 as masks. N-type impurity regions 208 and 209 were formed by implanting impurity ions (phosphorus ions in this case) over the entire surface. Thus, phosphorus was implanted at a dose of in a range of from $1\times10^{15}$ to $8\times10^{15}$ cm$^{-2}$ under an accelerating voltage of from 60 to 90 kV. More specifically in this case, phosphorus was implanted at a dose of $2\times10^{15}$ cm$^{-2}$ under an accelerating voltage of 80 kV (FIG. 2(B)).

After masking the region of N-channel TFT using a photoresist 210, boron was implanted to reverse the conductive type of the N-type impurity region 209. Thus was obtained a P-type impurity region 211. Boron was implanted at a dose of in a range of from $1\times10^{15}$ to $8\times10^{15}$ cm$^{-2}$ under an accelerating voltage of from 40 to 80 kV. More specifically in this case, boron was implanted at a dose higher than that of the previously implanted phosphorus; thus, boron was implanted at a dose of $5 \times 10^{15}$ cm$^{-2}$ under an accelerating voltage of 65 kV (FIG. 2(C)).

Then, laser radiation was irradiated to the resulting structure using a KrF excimer laser operated at a wavelength of 248 nm and at a pulse width of 20 nsec, to activate the doped impurity. The laser was operated at an energy density of from 200 to 400 MJ/cm$^2$, more preferably, at an energy density of from 250 to 300 MJ/cm$^2$.

A 5,000 Å thick silicon oxide film 212 was deposited thereafter by means of CVD as an interlayer dielectric over the entire surface of the resulting structure. The interlayer dielectric 212 and the gate insulating film 205 were etched to form contact holes in the source/drain of the TFT.

Then, an aluminum film 213 was deposited to a thickness of from 3,000 Å to 2 μm, preferably from 4,000 to 8,000 Å, for instance, to a thickness of 5,000 Å by means of sputtering. Then, an anodic oxide was formed to a thickness of from 50 to 300 Å, for instance, at a thickness of 150 Å by effecting anodic oxidation in an electrolytic solution in the same manner as described above. The substrate was immersed in the solution, and the positive side of a constant current supply was connected to the aluminum film on the substrate while connecting the negative side to a platinum electrode. By applying a voltage at a constant current of 20 mA, the oxidation was continued until a voltage in a range of from 5 to 30 V, specifically in this case, 10 V, was attained. The oxidation was further continued at a constant voltage of 10 V until the current decreased to 0.1 mA or lower. Thus was obtained an aluminum oxide film 150 Å in thickness (FIG. 2(D)).

The aluminum film 213 and the aluminum oxide film 214 thus obtained were etched to obtain second layer aluminum interconnections 215, 216, and 217. A passivation film 218 was formed thereafter. The passivation film was a silicon oxynitride (SiO$_x$, N$_y$) film deposited to a thickness of from 2,000 to 8,000 Å, for instance, 4,000 Å, by means of plasma CVD using a mixed gas of NH$_3$, SiH$_4$, N$_2$O and H$_2$. The substrate was maintained at a temperature in a range of from 250 to 350° C. during the film deposition (FIG. 2(E)).

In the present example again, the anodic oxide film 214 prevented hillocks from generating on the aluminum film.

EXAMPLE 3

Figure 3A:
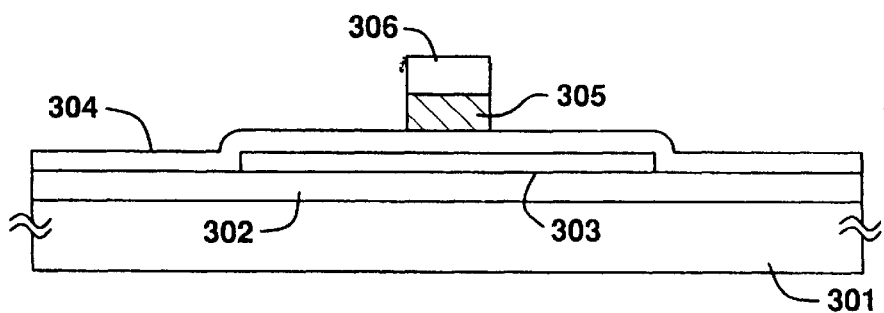
FIGS. 3(A) to 3(E) are each process steps according to the process of Example 3.
Figure 3B:
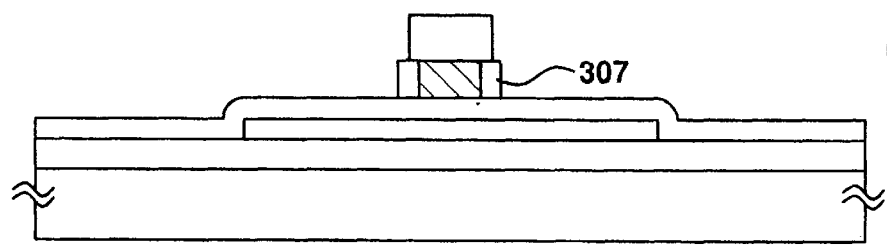
Figure 3C:
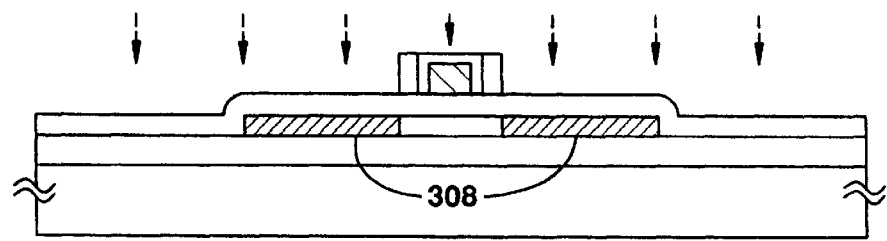
Figure 3D:
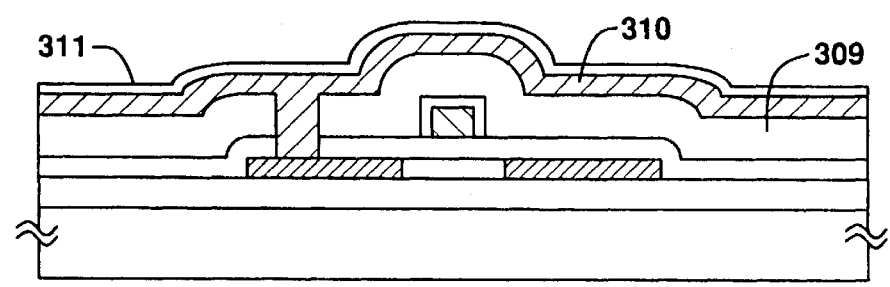
Figure 3E:
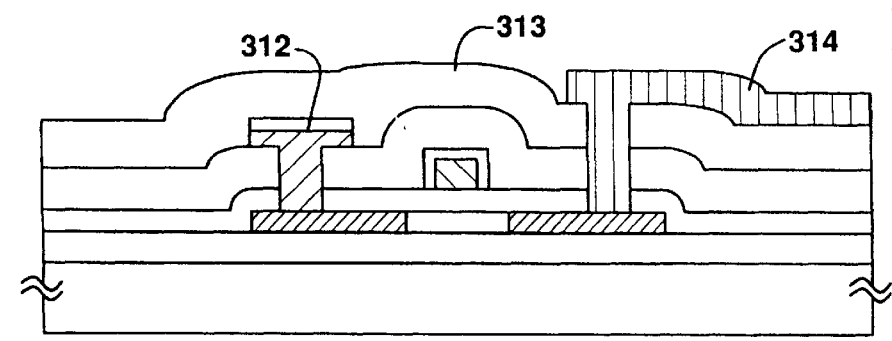

Referring to FIGS. 3(A) to 3(E), an example according to an embodiment of the present invention is described below. The present example is related to TFTs placed in the pixel portions of a liquid crystal display device of an active matrix type.

A 2,000 Å thick silicon oxide film 302 was deposited as a base film on a substrate 301 by means of plasma CVD. After depositing an amorphous silicon film to a thickness of 500 Å by plasma CVD, the resulting structure was allowed to stand in a reducing atmosphere maintained in a temperature range of from 550 to 600° C. for a duration of from 8 to 24 hours. Nickel may be added in a trace amount to accelerate the crystallization. Otherwise, the crystallization step may be effected by irradiating a laser radiation. The crystallized silicon film thus obtained was etched to form an island-like region 303. A gate insulating film was formed thereon by depositing a 1,200 Å thick silicon oxide film 304 using plasma CVD.

An aluminum film was deposited by sputtering to a thickness of from 1,000 Å to 3 μm, for instance, to a thickness of 6,000 Å. A thin anodic oxide film from 100 to 400 Å in thickness was formed on the surface of the aluminum film in the next step of anodic oxidation to maintain the photoresist tightly adhered to the surface of the aluminum film. A photoresist was formed by means of spin-coating to a thickness of about 1 μm on the thus treated aluminum film. The resulting film was subjected to a known photolithography to obtain a gate electrode 305. The gate electrode had a photoresist mask 306 thereon (FIG. 3(A)).

The substrate was then immersed in an aqueous 10% oxalic acid solution, and was subjected to anodic oxidation under a voltage in a range of from 5 to 50 V, for instance, 8 V, for a duration of form 10 to 500 minutes, for instance, for 200 minutes. Thus was formed a porous anodic oxide 307 about 5,000 Å in thickness on the side plane of the gate electrode. The photoresist mask 306 on the upper surface of the gate electrode prevented anodic oxidation from proceeding on the upper side of the gate electrode (FIG. 3(B)).

After removing the mask to expose the upper surface of the gate electrode, the substrate was immersed into an ethylene glycol solution containing 3% tartaric acid (whose pH was controlled to a neutral range by using ammonia), and current was applied at a constant value of 20 mA to raise the voltage up to 100 V. Anodic oxidation was performed in this manner. In this case, not only the upper surface but also the sides of the gate electrode were anodically oxidized to for a 1,000 Å thick dense pore-free anodic oxide.

Impurities were implanted by means of ion doping in a self-aligned manner into the island-like film 303 by using the gate electrode portion (i.e., the gate electrode and the surrounding anodic oxide film) as a mask. An N-type impurity region 308 was formed by implanting impurity ions (phosphorus ions in this case) over the entire surface. Thus, phosphorus was implanted at a dose of in a range of from $1 \times 10^{15}$ to $8 \times 10^{15}$ cm$^{-2}$ under an accelerating voltage of from 60 to 90 kV. More specifically in this case, phosphorus was implanted at a dose of $5 \times 10^{15}$ cm$^{-2}$ under an accelerating voltage of 80 kV (FIG. 3(C)).

The porous anodic oxide 307 was etched by using a phosphoric acid based etchant to expose the pore-free anodic oxide. Because the etching rate of the pore-free anodic oxide is extremely low in the phosphoric acid based etchant used herein, the porous anodic oxide 307 alone can be etched selectively while protecting the pore-free anodic oxide and the inner aluminum gate. Furthermore, because no impurity (phosphorus) was doped to the lower portion of the region in which the porous anodic oxide had been formed, an offset region was formed.

Then, laser radiation was irradiated to the resulting structure using a KrF excimer laser operated at a wavelength of 248 nm and at a pulse width of 20 nsec, to activate the doped impurity. The laser was operated at an energy density of from 200 to 400 mJ/cm$^2$, more preferably, at an energy density of from 250 to 300 mJ/cm$^2$. At the same time, the laser radiation was irradiated to the phase boundary portion between the impurity region 308 and the offset region. The laser radiation was found effective for preventing degradation from occurring at the phase boundary.

A 5,000 Å thick silicon oxide film 309 was deposited thereafter by means of CVD as an interlayer dielectric over the entire surface of the resulting structure. The interlayer dielectric 309 and the gate insulating film 304 were etched to form contact holes in the source/drain of the TFT.

Then, an aluminum film 310 was deposited to a thickness of from 3,000 Å to 2 μm, preferably from 4,000 to 8,000 Å, for instance, to a thickness of 5,000 Å by means of sputtering. An anodic oxide was formed in the same manner as in Example 1 to form an anodic oxide 311 to a thickness of 100 Å (FIG. 3(D)).

The aluminum film 310 and the aluminum oxide film 311 thus obtained were etched to obtain second layer aluminum interconnections 312. A passivation film 313, was formed thereafter to protect the element from the ambient. The passivation film was a silicon nitride film deposited to a thickness of 3,000 Å. In this step again, the anodic oxide film prevented hillocks from generating on the aluminum film The passivation film 313, the interlayer dielectric 309, and the gate insulating film 304 were etched to form contact holes for the pixel electrode. After depositing an ITO (indium tin oxide) film, an ITO pixel electrode 314 was formed by etching it (FIG. 3(E)).

The present Example refers to a liquid crystal display device. In a conventional liquid crystal display device, the active matrix substrate was disposed from the substrate opposed thereto at a distance of a mere 5 μm or so. The contact between the substrates due to the formation of hillocks on the interconnection was found a great problem. The product yield was improved in the present example in this manner by suppressing the formation of hillocks.

EXAMPLE 4

Figure 4A:
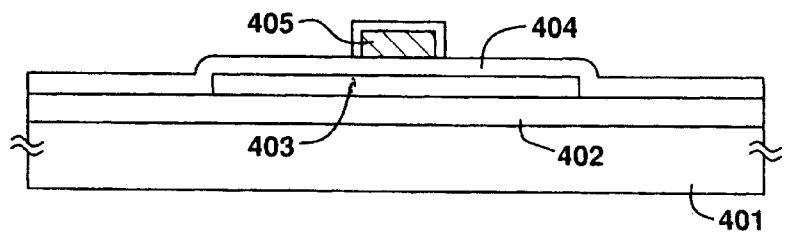
FIGS. 4(A) to 4(F) are each process steps according to the process of Example 4.
Figure 4B:
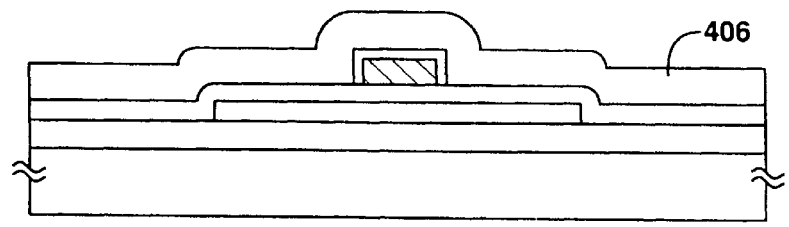
Figure 4C:
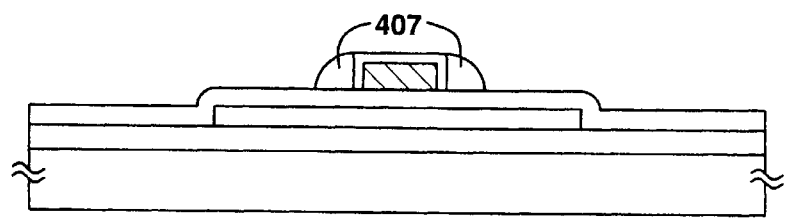
Figure 4D:
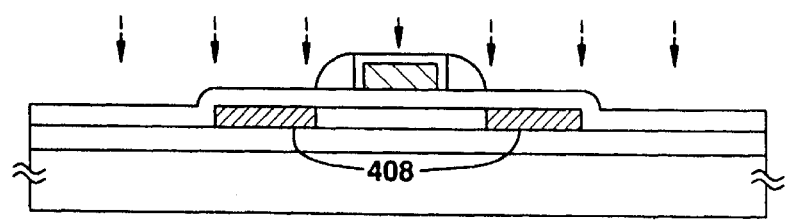
Figure 4E:
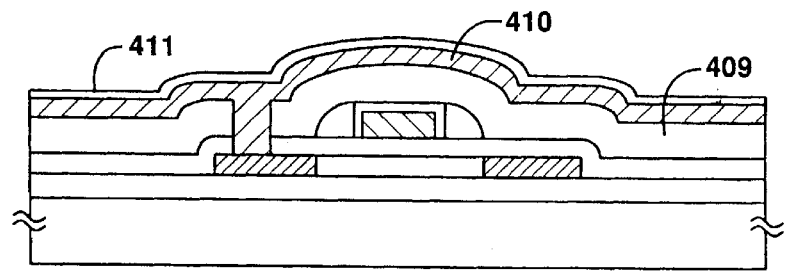
Figure 4F:
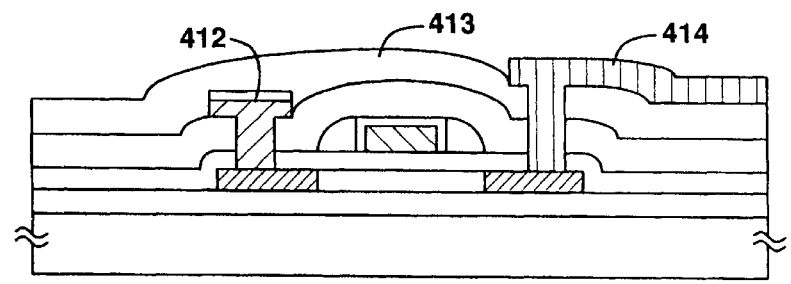

Referring to FIGS. 4(A) to 4(F), an example according to an embodiment of the present invention is described below. The present example is related to TFTs placed in the pixel portions of a liquid crystal display device of an active matrix type.

A 2,000 Å thick silicon oxide film 402 was deposited as a base film on a substrate 401 by means of plasma CVD. After depositing an amorphous silicon film to a thickness of 500 Å by plasma CVD, the resulting structure was allowed to stand in a reducing atmosphere maintained in a temperature range of from 550 to 600° C. for a duration of from 8 to 24 hours. Nickel may be added in a trace amount to accelerate the crystallization. Otherwise, the crystallization step may be effected by irradiating a laser radiation. The crystallized silicon film thus obtained was etched to form an island-like region 403. A gate insulating film was formed thereon by depositing a 1,200 Å thick silicon oxide film 404 using plasma CVD.

An aluminum film was deposited by sputtering to a thickness of from 1,000 Å to 3 μm, for instance, to a thickness of 6,000 Å, and was then etched to form a gate electrode 405. The gate electrode was anodically oxidized by applying a current to the gate electrode in an electrolytic solution. Thus was obtained a 2,000 Å thick anodic oxide (FIG. 4(A)).

A silicon oxide film 406 was deposited by plasma CVD. This silicon oxide film 406 was used to form side walls. Accordingly, optimal thickness of the silicon oxide film differs depending on the height of the gate electrode. In case the height of the gate electrode portion (i.e., the gate electrode and the surrounding anodic oxide film) is about 6,000 Å, a preferred thickness is in a range of from 2,000 Å to 1.2 μm, corresponding to about ⅓ to 2 times the height of the gate electrode. Thus, a 6,000 Å thick silicon oxide film was deposited in this case (FIG. 4(B)).

The resulting silicon oxide film was etched by effecting an anisotropic dry etching using a known RIE (reactive ion etching) process. The etching was completed at the point it reached the gate insulating film. An insulator 407 (side wall) was formed approximately in a triangular shape on the side plane of the gate electrode portion in this mariner (FIG. 4(C)).

Impurity ions (i.e., phosphorus ions in this case) were implanted by means of ion doping in a self-aligned manner into the island-like film 403 by using the gate electrode portion 405 and the side wall 407 as masks. An N-type impurity region 408 was formed by implanting the impurity at a dose of in a range of from $1\times10^{15}$ to $8\times10^{15}$ cm$^{-2}$ under an accelerating voltage of from 60 to 90 kV. More specifically in this case, phosphorus was implanted at a dose of $5\times10^{15}$ cm$^{-2}$ under an accelerating voltage of 80 kV. No impurity was implanted into the portion under the side wall portion, and this portion became an offset region.

Then, to activate the doped impurity, laser radiation was irradiated to the resulting structure using a KrF excimer laser operated at a wavelength of 248 nm and at a pulse width of 20 nsec. The laser was operated at an energy density of from 200 to 400 mJ/cm$^2$, more preferably, at an energy density of from 250 to 300 mJ/cm$^2$ (FIG. 4(D)).

A 5,000 Å thick silicon oxide film 409 was deposited thereafter by means of CVD as an interlayer dielectric over the entire surface of the resulting structure. The interlayer dielectric 409 and the gate insulating film 404 were etched to form contact holes in the source/drain of the TFT.

Then, an aluminum film 410 was deposited to a thickness of from 3,000 Å to 2 μm. preferably from 4,000 to 8,000 Å, for instance, to a thickness of 5,000 Å by means of sputtering. An anodic oxide was formed in the same manner as above to form an anodic oxide 411 at a thickness of from 50 to 500 Å, for instance, at a thickness of 250 Å (FIG. 4(E)).

The aluminum film 410 and the aluminum oxide film 411 thus obtained were etched to obtain second layer aluminum interconnections 412. A passivation film 413 was formed thereafter to protect the element from the ambient. The passivation film was a silicon nitride film deposited to a thickness of 4,000 Å.

The passivation film 413, the interlayer dielectric 409, and the gate insulating film 404 were etched to form contact holes for the pixel electrode. After depositing an ITO (indium tin oxide) film, an ITO pixel electrode 414 was formed by etching (FIG. 3(F)).

Thus was obtained a pixel TFT having an offset region at the lower portion of the side wall.

As described in the foregoing, the present invention suppresses the generation of hillocks on the second layer aluminum interconnection. Thus, the formation of defective portions such as short circuit can be avoided. Particularly in the fabrication of an IC (integrated circuit) consisting of numerous elements and interconnections, a single defect may be fatal to the entire IC. The present invention considerably reduces such defects to enable the fabrication of ICs at an improved product yield.

While the invention has been described in detail and with reference to specific embodiments thereof, it will be apparent to one skilled in the art that various changes and modifications can be made therein without departing from the spirit and scope thereof.

What is claimed is:

1. A semiconductor device comprising:
   a substrate;
   a thin film transistor formed over said substrate, said thin film transistor having at least a semiconductor film including source, drain and channel regions, a gate insulating film adjacent to said semiconductor film and a gate electrode adjacent to said gate insulating film;
   a first insulating film covering at least said channel region of said thin film transistor, wherein said first insulating film comprises silicon oxide; and a second insulating film having a thickness between 2000 and 8000 Å formed on said first insulating film, wherein said second insulating film comprises silicon nitride.

2. A liquid crystal device using the semiconductor device of claim 1.

3. A semiconductor device comprising:

a substrate;

a thin film transistor formed over said substrate, said thin film transistor having at least a semiconductor film including source, drain and channel regions, a gate insulating film adjacent to said semiconductor film and a gate electrode over said channel region with said gate insulating film interposed therebetween;

a first insulating film covering at least said channel region of said thin film transistor, wherein said first insulating film comprises silicon oxide; and a second insulating film having a thickness between 2000 and 8000 Å formed on said first insulating film, wherein said second insulating film comprises silicon nitride.

4. A liquid crystal device using the semiconductor device of claim 3.

5. A semiconductor device comprising:

a substrate;

a thin film transistor formed over said substrate, said thin film transistor having at least a semiconductor film including source, drain and channel regions, a gate insulating film adjacent to said semiconductor film and a gate electrode adjacent to said gate insulating film;

a first insulating film covering at least said channel region of said thin film transistor, wherein said first insulating film comprises silicon oxide; and a second insulating film having a thickness between 2000 and 8000 Å formed on said first insulating film, wherein said second insulating film comprises silicon oxynitride.

6. A liquid crystal device using the semiconductor device of claim 5.

7. A semiconductor device comprising:

a substrate;

a thin film transistor formed over said substrate, said thin film transistor having at least a semiconductor film including source, drain and channel regions, a gate insulating film adjacent to said semiconductor film and a gate electrode over said channel region with said gate insulating film interposed therebetween;

a first insulating film covering at least said channel region of said thin film transistor, wherein said first insulating film comprises silicon oxide; and a second insulating film having a thickness between 2000 and 8000 Å formed on said first insulating film, wherein said second insulating film comprises silicon oxynitride.

8. A liquid crystal device using the semiconductor device of claim 7.

9. A semiconductor device comprising:

a substrate;

a thin film transistor formed over said substrate, said thin film transistor having at least a semiconductor film including source, drain and channel regions, a gate insulating film adjacent to said semiconductor film and a gate electrode over said channel region with said gate insulating film interposed therebetween;

a first insulating film covering at least said channel region of said thin film transistor, wherein said first insulating film comprises silicon oxide;

a source or drain electrode formed on said first insulating film, wherein said source or drain electrode is electrically connected to one of said source and drain regions through a contact hole in said first insulating film; and a second insulating film having a thickness between 2000 and 8000 Å formed on said first insulating film, wherein said second insulating film comprises silicon nitride.

10. A liquid crystal device using the semiconductor device of claim 9.

11. A semiconductor device comprising:

a substrate;

a thin film transistor formed over said substrate, said thin film transistor having at least a semiconductor film including source, drain and channel regions, a gate insulating film adjacent to said semiconductor film and a gate electrode adjacent to said gate insulating film;

a first insulating film covering at least said channel region of said thin film transistor, wherein said first insulating film comprises silicon oxide;

a source or drain electrode formed on said first insulating film, wherein said source or drain electrode is electrically connected to one of said source and drain regions through a contact hole in said first insulating film; and a second insulating film having a thickness between 2000 and 8000 Å formed on said source or drain electrode and said first insulating film, wherein said second insulating film comprises silicon nitride.

12. A liquid crystal device using the semiconductor device of claim 11.

13. A semiconductor device according to claim 11 wherein said source or drain electrode comprises an anodic oxide film on at least a top surface of said source or drain electrode.

14. A semiconductor device comprising:

a substrate;

a CMOS thin film transistor comprising a P-channel thin film transistor and an N-channel thin film transistor formed over said substrate, each of said P-channel thin film transistor and said N-channel thin film transistor having at least a semiconductor film including source, drain and channel regions, a gate insulating film adjacent to said semiconductor film and a gate electrode adjacent to said gate insulating film;

a first insulating film covering at least said channel region of said CMOS thin film transistor, wherein said first insulating film comprises silicon oxide;

a source or drain electrode formed on said first insulating film, wherein said source or drain electrode is electrically connected to one of said source and drain regions through a contact hole in said first insulating film; and a second insulating film formed on said source or drain electrode and said first insulating film, wherein said second insulating film comprises silicon oxynitride.

15. A semiconductor device according to claim 14 wherein said second insulating film has a thickness within a range from 2000 to 8000 Å.

16. A liquid crystal device using the semiconductor device of claim 14.

17. A semiconductor device according to claim 14 wherein said source or drain electrode comprises an anodic oxide film on at least a top surface of said source or drain electrode.

18. An integrated circuit using the semiconductor device of claim 1.

19. An integrated circuit using the semiconductor device of claim 3.

20. An integrated circuit using the semiconductor device of claim 5.

21. An integrated circuit using the semiconductor device of claim 7.

22. An integrated circuit using the semiconductor device of claim 9.

23. An integrated circuit using the semiconductor device of claim 11.

24. An integrated circuit using the semiconductor device of claim 14.

25. A semiconductor device comprising:

a thin film transistor formed on an insulating film comprising silicon oxide, said thin film transistor having at least a semiconductor film including source, drain and channel regions, a gate insulating film adjacent to said semiconductor film and a gate electrode adjacent to said gate insulating film;

a first insulating film covering at least said channel region and said gate electrode, wherein said first insulating film comprises silicon oxide; and a second insulating film having a thickness between 2000 and 8000 Å formed on said first insulating film, wherein said second insulating film comprises silicon nitride.

26. A liquid crystal device using the semiconductor device of claims 25.

27. An integrated circuit using the semiconductor device of claim 25.

28. A semiconductor device comprising:

a thin film transistor formed on an insulating film comprising silicon oxide, said thin film transistor having at least a semiconductor film including source, drain and channel regions, a gate insulating film adjacent to said semiconductor film and a gate electrode adjacent to said gate insulating film;

a first insulating film covering at least said channel region and said gate electrode, wherein said first insulating film comprises silicon oxide; and a second insulating film having a thickness between 2000 and 8000 Å formed on said first insulating film, wherein said second insulating film comprises silicon oxynitride.

29. A liquid crystal device using the semiconductor device of claim 28.

30. An integrated circuit using the semiconductor device of claim 28.

31. A semiconductor device comprising:

a thin film transistor formed on an insulating film comprising silicon oxide, said thin film transistor having at least a semiconductor film including source, drain and channel regions, a gate insulating film adjacent to said semiconductor film and a gate electrode adjacent to said gate insulating film;

a first insulating film covering at least said channel region and said gate electrode, wherein said first insulating film comprises silicon oxide; and a source or drain electrode formed on said first insulating film, wherein said source or drain electrode is electrically connected to one of said source and drain regions through a contact hole in said first insulating film; and a second insulating film formed on said source or drain electrode and said first insulating film, wherein said second insulating film comprises silicon oxynitride.

32. A liquid crystal device using the semiconductor device of claim 31.

33. An integrated circuit using the semiconductor device of claim 31.

* * * * *